United States Patent
Ji et al.

(10) Patent No.: US 11,698,830 B2
(45) Date of Patent: Jul. 11, 2023

(54) SEMICONDUCTOR MEMORY (71) Applicant: CHANGXIN MEMORY TECHNOLOGIES, INC., Hefei (CN)

(72) Inventors: KangLing Ji, Hefei (CN); Hongwen Li, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 86 days.

(21) Appl. No.: 17/445,984

(22) Filed: Aug. 26, 2021

(65) Prior Publication Data

US 2022/0083418 A1 Mar. 17, 2022

Related U.S. Application Data (63) Continuation of application No. PCT/CN2021/100512, filed on Jun. 17, 2021.

(30) Foreign Application Priority Data

Sep. 14, 2020 (CN) .......................... 202010958693.0

(51) Int. Cl.
*G06F 11/10* (2006.01)
*G06F 13/16* (2006.01)

(52) U.S. Cl.
CPC ...... *G06F 11/1004* (2013.01); *G06F 11/1068* (2013.01); *G06F 13/1668* (2013.01)

(58) Field of Classification Search
None
See application file for complete search history.

(56) References Cited

U.S. PATENT DOCUMENTS 6,333,878 B2 * 12/2001 Ooishi ............... G11C 29/24
                                                        365/225.7
10,484,174 B1 * 11/2019 Bernat ............... H04L 63/0815
(Continued)

FOREIGN PATENT DOCUMENTS

CN 102332295 A 1/2012
CN 101964205 B 8/2013
(Continued)

OTHER PUBLICATIONS

M. Taguchi et al., "A 40-ns 64-Mb DRAM with 64-b parallel data bus architecture," in IEEE Journal of Solid-State Circuits, vol. 26, No. 11, pp. 1493-1497, Nov. 1991, doi: 10.1109/4.98963. (Year: 1991).*

(Continued)

*Primary Examiner* — Daniel F. McMahon
(74) *Attorney, Agent, or Firm* — Syncoda LLC; Feng Ma (57) ABSTRACT

A semiconductor memory includes storage arrays, at least one verification module and gating circuits. Each verification module corresponds to multiple storage arrays. The verification module is configured to verify whether an error occurs in data information of the corresponding storage arrays. Each verification module is connected to a group of global data buses. The gating circuits are respectively connected to the storage arrays and the global data buses, and the gating circuits are configured to control on and off of a data transmission path connecting the global data buses to the storage arrays.

12 Claims, 7 Drawing Sheets

(56) References Cited

U.S. PATENT DOCUMENTS

| | | | |
|---|---|---|---|
| 2006/0034141 A1* | 2/2006 | Iioka | G11C 16/0416 365/230.03 |
| 2008/0229035 A1* | 9/2008 | Thayer | G06F 12/0607 711/157 |
| 2009/0207642 A1* | 8/2009 | Shimano | G11C 11/1675 365/72 |
| 2010/0034025 A1* | 2/2010 | Yanagi | G11C 16/349 365/191 |
| 2013/0297987 A1* | 11/2013 | Gupta | G06F 11/1064 714/E11.054 |
| 2013/0314992 A1* | 11/2013 | Takagiwa | G11C 16/0483 365/185.09 |
| 2014/0359395 A1* | 12/2014 | Ellis | G06F 11/1008 714/763 |
| 2016/0180948 A1* | 6/2016 | Tanabe | G11C 16/24 365/185.21 |
| 2016/0259693 A1* | 9/2016 | Sundararaman | G06F 16/2365 |
| 2017/0083401 A1 | 3/2017 | Ryu et al. | |
| 2017/0308299 A1 | 10/2017 | Cha et al. | |
| 2018/0074952 A1* | 3/2018 | Sudo | G06F 12/126 |
| 2019/0250985 A1* | 8/2019 | Seo | G06F 11/1068 |
| 2020/0021653 A1* | 1/2020 | Rao | G06F 9/3891 |
| 2020/0134202 A1* | 4/2020 | Sapuntzakis | G06F 21/602 |
| 2021/0081278 A1 | 3/2021 | Seo et al. | |

FOREIGN PATENT DOCUMENTS

| | | |
|---|---|---|
| CN | 107393596 A | 11/2017 |
| CN | 213183603 U | 5/2021 |
| WO | 2021056887 A1 | 4/2021 |

OTHER PUBLICATIONS

B. Zhang, R. Raja Chandrasekar, A. Haghdoost, L. Evans and D. Du, "Improving Data Integrity in Linux Software RAID with Protection Information (T10-PI)," 2018 18th IEEE/ACM International Symposium on Cluster, Cloud and Grid Computing (CCGRID), Washington, DC, USA, 2018, pp. 609-615, (Year: 2018).*

Supplementary European Search Report in the European application No. 21863078.8, dated Oct. 20, 2022.

International Search Report in the international application No. PCT/CN2021/100512, dated Sep. 15, 2021.

* cited by examiner

SEMICONDUCTOR MEMORY

CROSS-REFERENCE TO RELATED APPLICATIONS

This application is a continuation of International Application No. PCT/CN2021/100512 filed on Jun. 17, 2021, which claims priority to Chinese Patent Application No. 202010958693.0 filed on Sep. 14, 2020. The disclosures of these applications are hereby incorporated by reference in their entirety.

BACKGROUND

Semiconductor memory is a memory to be accessed with a semiconductor circuit. The dynamic random access memory (DRAM) is widely applied in various fields due to its high storage speed and high integration.

SUMMARY

This disclosure relates to generally to semiconductor technologies, and more specifically to semiconductor memory.

According to a plurality of embodiments, this application provides a semiconductor memory, which includes storage array, at least one verification module and gating circuits.

Each verification module corresponds to the plurality of storage arrays, the verification module is configured to verify whether an error occurs in data information of the corresponding storage arrays, and each verification module is connected to a group of global data buses.

The gating circuits are respectively connected to the storage arrays and the global data buses, and the gating circuits are configured to control on and off of a data transmission path that connects the global data buses to the storage arrays.

The details of one or more embodiments of this application are provided in the drawings and description below. Other characteristics and advantages of this application will become apparent from the description, drawings and claims.

BRIEF DESCRIPTION OF THE DRAWINGS

To better clarify the embodiments of this application, the drawings required for the illustration of the embodiments will be briefly described blow. It is apparent that the drawings described below merely illustrate some embodiments of this application. A person having ordinary skill in the art can obtain other drawings without creative labor on the basis of those drawings.

NUMERAL REFERENCES storage block: 10; storage array: 100; first array: 110; second array: 120; third array: 130; word line: 140; first word line: 141; second word line: 142; bit line: 150; first bit line: 151; second bit line: 152; column select line: 160; verification module: 200; coding unit: 210; error detection unit: 220; error correction unit: 230; gating circuit: 300; first gating circuit: 310; second gating circuit: 320; third gating circuit: 330; gating control module: 400; read-write control module: 500; byte data port: 600; first byte data port: 610; second byte data port: 620; global data bus: 700

DETAILED DESCRIPTION

To obtain higher data read-write reliability, a verification module is required to be arranged in a semiconductor memory, so as to verify whether the read data is accurate. At present, the verification module needs to occupy a lot of space in the semiconductor memory, thereby not further reducing the volume of the memory.

To facilitate the understanding of the embodiments of this application, the embodiments of this application are described more comprehensively with reference to the related drawings. Some embodiments of this application are provided in the drawings. However, the embodiments of this application may be implemented in many different manners, and are not limited to the embodiments described in this application. On the contrary, these embodiments are provided to make the disclosed contents of the embodiments of this application more thorough and comprehensive.

Unless otherwise defined, all technical and scientific terms used in this application have the same meaning with the usual understanding of those skilled in the art to which the embodiments of this application belong. The terms used in the description of the embodiments of this application are merely for the purpose of describing the specific embodiments instead of limiting to the embodiments of this application. The terms "and/or" used in this application include random and all combinations of one or more related listed items.

Figure 1:
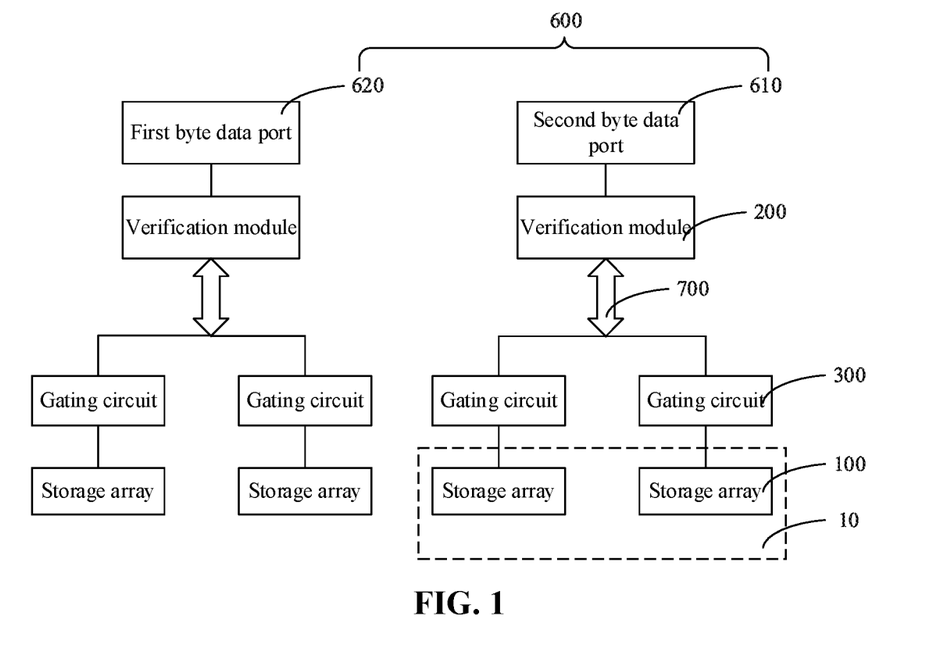
FIG. 1 is a structural schematic diagram of a semiconductor memory with a half storage block structure according to an embodiment.

FIG. 1 is a structural schematic diagram of a semiconductor memory with a half storage block structure according to an embodiment. Referring to FIG. 1, in this embodiment, the semiconductor memory includes storage arrays 100, at least one verification module 200 and gating circuits 300.

The storage arrays 100 are configured to store data, so as to implement a storage function of the semiconductor memory. Specifically, a storage array 100 includes a word line, a bit line and a storage unit. The storage unit further includes a storage capacitance and a transistor. A control end of the transistor is connected to the word line, a first end of the transistor is connected to the storage capacitance, and a second end of the transistor is connected to the bit line. When the transistor is turned on under the control of the word line, the storage capacitance is conducted to the bit line, so as to implement read-write of data information, this is, when data information is read, the stored data information is transmitted to the bit line through the storage capacitance;

and when the data information is written, the data information to be written is transmitted to the storage capacitance through the bit line.

Each verification module 200 corresponds to multiple storage arrays 100. The verification module 200 is configured to verify whether an error occurs in the data information of the corresponding storage arrays 100, that is, each verification module 200 is configured to verify the data information of the multiple storage arrays 100, so as to implement the quantity optimization of the verification module 200. Each verification module 200 is connected to a group of global data buses 700, and the verification module 200 implements sending and reception of the data information through the global data buses 700.

The gating circuits 300 are connected to the storage arrays 100 and the global data buses 700 respectively, and the gating circuits 300 are configured to control on and off of a data transmission path connecting the global data buses 700 to the storage arrays 100. Specifically, at the same moment, the gating circuits 300 control the global data buses 700 to be conducted to at most one of the storage arrays 100. In this embodiment, since the global data buses 700 are connected to the verification module 200, the on/off condition of the data transmission path between the global data buses 700 and the storage arrays 100 is that of the data transmission path between the verification module 200 and the storage arrays 100. Therefore, when the gating circuits 300 are turned on, the data transmission path between the global data buses 700 and the storage arrays 100 is conducted, and correspondingly, the data transmission path between the verification module 200 and the storage arrays 100 is conducted. When the gating circuits 300 are turned off, the data transmission path between the global data buses 700 and the storage arrays 100 is disconnected, and correspondingly, the data transmission path between the verification module 200 and the storage arrays 100 is disconnected.

In this embodiment, the semiconductor memory includes storage arrays 100, at least one verification module 200 and gating circuits 300. Each verification module 200 corresponds to multiple storage arrays 100. The verification module 200 is configured to verify whether an error occurs in the data information of the corresponding storage arrays 100. Each verification module 200 is connected to a group of global data buses 700. The gating circuits 300 are connected to the storage arrays 100 and the global data buses 700 respectively, and the gating circuits 300 are configured to control on and off of the data transmission path connecting the global data buses 700 to the storage arrays 100. This embodiment may control the on and off of the data transmission path between the global data buses 700 and each storage array 100, so that the storage arrays 100 connected to the same verification module 200 read the data information at different time, and the verification module 200 only needs to verify the data information of the storage array 100 that is read in real time. Therefore, in a case of adopting a small number of verification modules 200, the semiconductor memory of this embodiment can ensure that the data information from each reading is verified effectively, and a semiconductor memory with a verification module 200 occupying less space is provided.

Further, with continued reference to FIG. 1, the semiconductor memory further includes at least one byte data port 600. The byte data port 600 is connected in one-to-one correspondence to the verification module 200. The byte data port 600 is configured to receive the data information input from the outside or output the read data information to the outside. FIG. 1 shows two byte data ports 600 and two storage blocks 10. The two byte data ports 600 specifically include a first byte data port 610 and a second byte data port 620. Each storage block 10 includes multiple storage arrays 100. The byte data ports 600, the verification modules 200 and the storage blocks 10 are connected in one-to-one correspondence, that is, the storage arrays 100 in each storage block 10 are connected to the same verification module 200 and then connected to the same byte data port 600 through the verification module 200. It should be noted that the abovementioned byte data ports 600 and the verification modules 200 are merely used for illustration, and no limits are made thereto in the embodiments of the disclosure. In other embodiments, the byte data ports 600 may be not in one-to-one correspondence to the verification modules 200, for example, multiple byte data ports 600 correspond to one verification module 200. Those skilled in the art may make their own choice as needed. In addition, the storage block 10 in the embodiment may be a complete bank, or a half of the bank, or others. No limits are made thereto in the embodiments.

Each byte data port 600 may be configured to transmit 8-bit input data, that is, the first byte data port 610 is configured to transmit DQ<0:7>, the first byte data port 610 is configured to transmit DQ<8:15>, and the semiconductor memory may adopt a half storage block structure for storing the data information according to parameter performances of an external device. Taking the first byte data port 610 as an example, when data information is written, 8-bit data to be written is sent out by the external device, and is transmitted to one of two storage arrays 100 connected to the first byte data port 610 through the first byte data port 610. When data information is read, 8-bit data is read from one of two storage arrays 100 connected to the first byte data port 610, and is transmitted to the external device through the first byte data port 610. The data transmission manner of the second byte data port 620 is the same as that of the first byte data port 610, and details are not described herein. It should be noted that, because of a prefetching (or burst) function design of an existing memory, in each time the external device communicates with each byte data port of the memory, transmission of 8-bit data may be performed for multiple times. No limits are made thereto in the embodiments of the disclosure.

Figure 2:
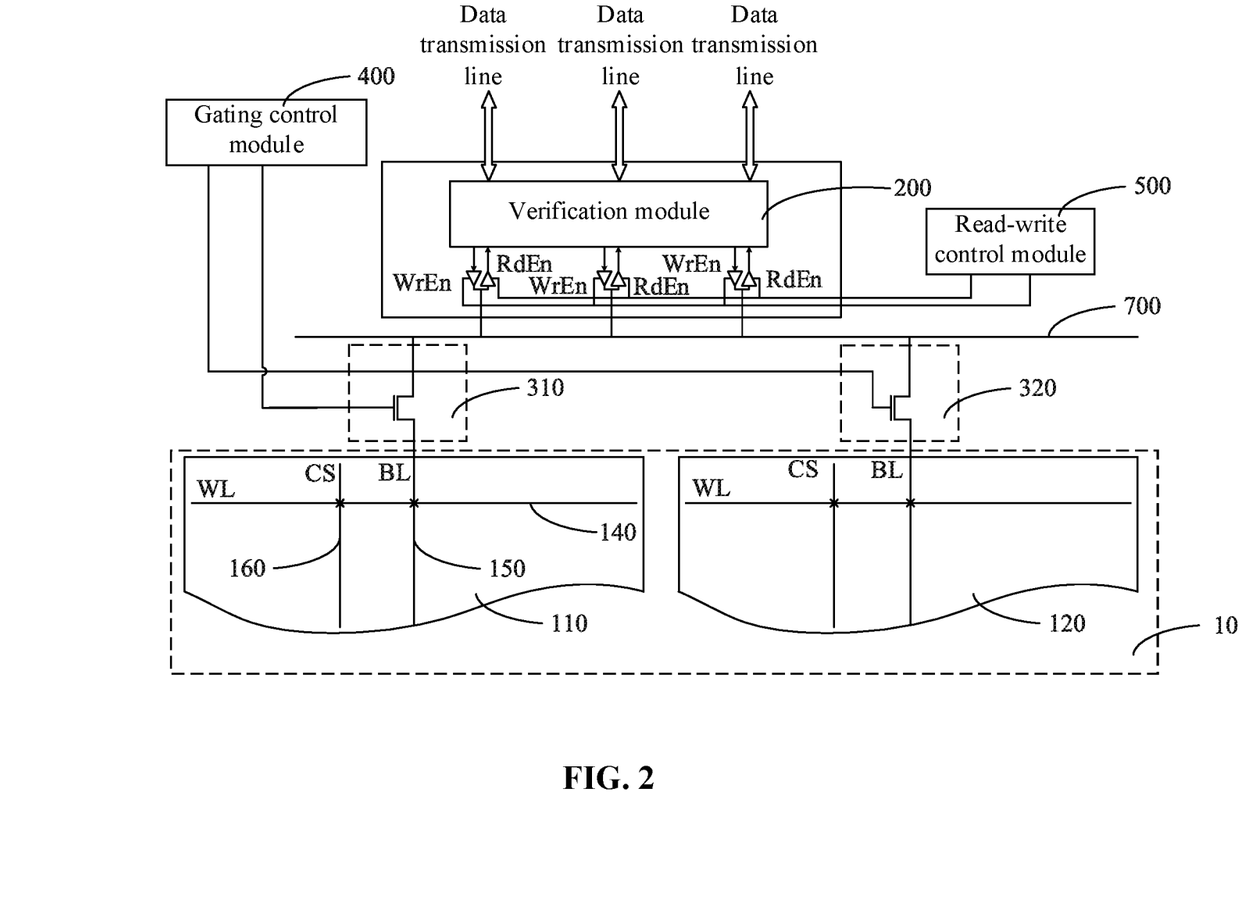
FIG. 2 is a structural schematic diagram of a semiconductor memory with a half storage block structure according to another embodiment.

FIG. 2 is a structural schematic diagram of a semiconductor memory with a half storage block structure according to another embodiment. It should be noted that the verification modules 200 and the storage arrays 100 corresponding to different byte data ports 600 in the embodiment have the same connection manner. In order to simplify the drawing, FIG. 2 shows and illustrates the verification module 200 and the storage array 100 that are connected to one byte data port 600, and the connection manner of other byte data ports 600 may refer to FIG. 2. The same simplification is also carried out in the drawing of the embodiment of another half storage block structure, and details are not described in other embodiments.

Referring to FIG. 2, in this embodiment, the semiconductor memory includes two storage arrays 100 and one verification module 200, the storage arrays 100 are in one-to-one correspondence to the gating circuits 300, and the storage arrays 100 are connected to the verification module 200 through the corresponding gating circuits 300 and the global data bus 700. The two storage arrays 100 are a first array 110 and a second array 120 respectively. The first array 110 is connected to the global data bus 700 through a first gating circuit 310, and the second array 120 is connected to the global data bus 700 through a second gating circuit 320. The verification module 200 is connected to the byte data port 600 through multiple data transmission lines. FIG. 2 shows three data transmission lines. However, it should be understood that the number of the data transmission lines is not limited to three, for example, the number may be one, eight, etc.

Specifically, at the same moment, at most one of the first gating circuit 310 and the second gating circuit 320 is turned on. That is, when data transmission is carried out at the byte data port 600 corresponding to the verification module 200 in FIG. 2, the data information is transmitted between the byte data port 600 and the verification module 200 through a data transmission line, the verification module 200 is turned on, one of the first gating circuit 310 and the second gating circuit 320 is turned on, so that read-write of data information is performed in the first array 110 or the second array 120. When the corresponding byte data port 600 does not perform data transmission, the data transmission line is not configured to transmit the data information, the verification module 200 is turned off, the first gating circuit 310 and the second gating circuit 320 are turned off, so that the first array 110 or the second array 120 is in a standby state and read-write of the data information is not performed.

In this embodiment, the verification module 200 and one of the two storage arrays 100 are selected to be turned on through the gating circuit 300, so as to realize read-write of the data information in different storage arrays 100. When read-write of data is performed on any one storage array 100, the data is verified through the same verification module 200 connected to the storage array 100, so that the number of the verification module 200 to be arranged is reduced and the occupied space of the verification module 200 in the semiconductor memory is reduced through a manner of improving the usage rate of the verification module 200, and then the semiconductor memory with higher integration and smaller volume is implemented.

With continued reference to FIG. 2, in one embodiment, the semiconductor memory further includes a gating control module 400, which is configured to generate gating signals. The gating circuit 300 includes a switch transistor. A control end of the switch transistor is connected to the gating control module 400, a first end of the switch transistor is connected to the global data bus 700, a second end of the switch transistor is connected to the storage arrays 100, and the switch transistor is configured to select to conduct or disconnect the data transmission path between the first end and the second end under the control of a gating signal. In order to facilitate description, the first gating circuit 310 is defined to include a first switch transistor, and the second gating circuit 310 is defined to include a second switch transistor.

Exemplarily, the first switch transistor and the second switch transistor may have the same conduction characteristic. For example, the two switch transistors are turned on when the control ends of the two switch transistors receive high-level signals. If the gating control module 400 outputs a high-level signal to the first switch transistor and outputs a low-level signal to the second switch transistor, the data transmission path between the first array 110 and the verification module 200 is conducted, and the data transmission path between the second array 120 and the verification module 200 is disconnected, so that read-write of data information is performed in the first array 110, and the data information read and written in the first array 110 is verified through the verification module 200. This example provides a setting method for the switch transistor, so that the control logic of the switch transistor is simpler. Moreover, when the storage arrays 100 need to be added in the storage block 10 continuously, the corresponding extension may be carried out according to the setting method for the existing switch transistor.

Exemplarily, the first switch transistor and the second switch transistor may have different conduction characteristics. For example, the first switch transistor is turned on when the control end of the first switch transistor receives a high-level signal, and the second switch transistor is turned on when the control end of the second switch transistor receives a low-level signal. If the gating control module 400 outputs the high-level signal to the first switch transistor and the second switch transistor at the same time, the data transmission path between the first array 110 and the verification module 200 is conducted, and the data transmission path between the second array 120 and the verification module 200 is disconnected, so that read-write of data information is performed in the first array 110, and read-write of data information through the first array 110 is verified through the verification module 200. This example provides another setting method for switch transistor, and the setting manner of this example is applicable to a case that each storage block 10 includes two storage arrays 100. Compared with the previous example, this example may omit the circuit gating signal in one path, so that the wiring between the verification module 200 and the storage array 100 is simplified.

In one embodiment, the switch transistor is a high-voltage switch transistor. Specifically, the switch transistor may be a higher-voltage transistor in a chip, which usually has a thick gate oxide layer and/or higher threshold voltage, etc. No limits are made thereto in the embodiments of the disclosure, and the high-voltage switch transistor herein is only the concept relative to other transistors in the chip.

Multiple storage units are included in the storage array 100, and each storage array 100 is connected to multiple word lines 140 (WL in the figure), multiple bit lines 150 (BL in the figure) and multiple column select lines 160 (CS in the figure). The word lines 140 are connected to multiple storage units along a row direction, and the bit lines 150 are connected to multiple storage units along a column direction; when the word line 140 corresponding to the storage units are turned on, the storage units may implement read-write of data, that is, the storage units may obtain the data to be written from the corresponding bit line 150 or send the stored data to the corresponding bit line 150. It should be noted that the word lines 140, the column select lines 160 and the bit lines 150 shown in FIG. 2 are simple indications and do not represent the respective connection relationship, and the relationship among the word lines 140, the column select lines 160 and the bit lines 150 may refer to the conventional setting in the memory.

In one embodiment, the semiconductor memory further include a read-write control module 500, which is connected to the verification module 200 and the global data bus 700 respectively. The read-write control module 500 is configured to receive a read-write enable signal (a read enable signal RdEn and a write enable signal WrEn), and select a data transmission direction between the verification module 200 and the corresponding global data bus 700 under the control of the read-write enable signal. Specifically, the read-write control module 500 may include multiple read-write control units, the number of the read-write control units matches with the bit number of the data information to be read and written, for example, each verification module 200 may be connected to eight read-write control units correspondingly.

Further, the read-write control units may be bidirectional drivers. A data flow direction from the verification module 200 to the global data bus 700 is a writing direction, and a data flow direction from the global data bus 700 to the verification module 200 is a reading direction. One write control unit is arranged on an output transmission path in the writing direction, a read control unit is arranged on an output transmission path in the reading direction, and the write control unit and the read control unit are not turned on at the same time. The write control unit receives the write enable signal WrEn and conducts the data transmission path in the writing direction under the control of the write enable signal WrEn, so that the verification module 200 sends the data information to be written to the global data bus 700. The read control unit receives the read enable signal RdEn and conducts the data transmission path in the reading direction under the control of the read enable signal RdEn, so that the verification module 200 acquires the read data information from the global data bus 700.

Figure 3:
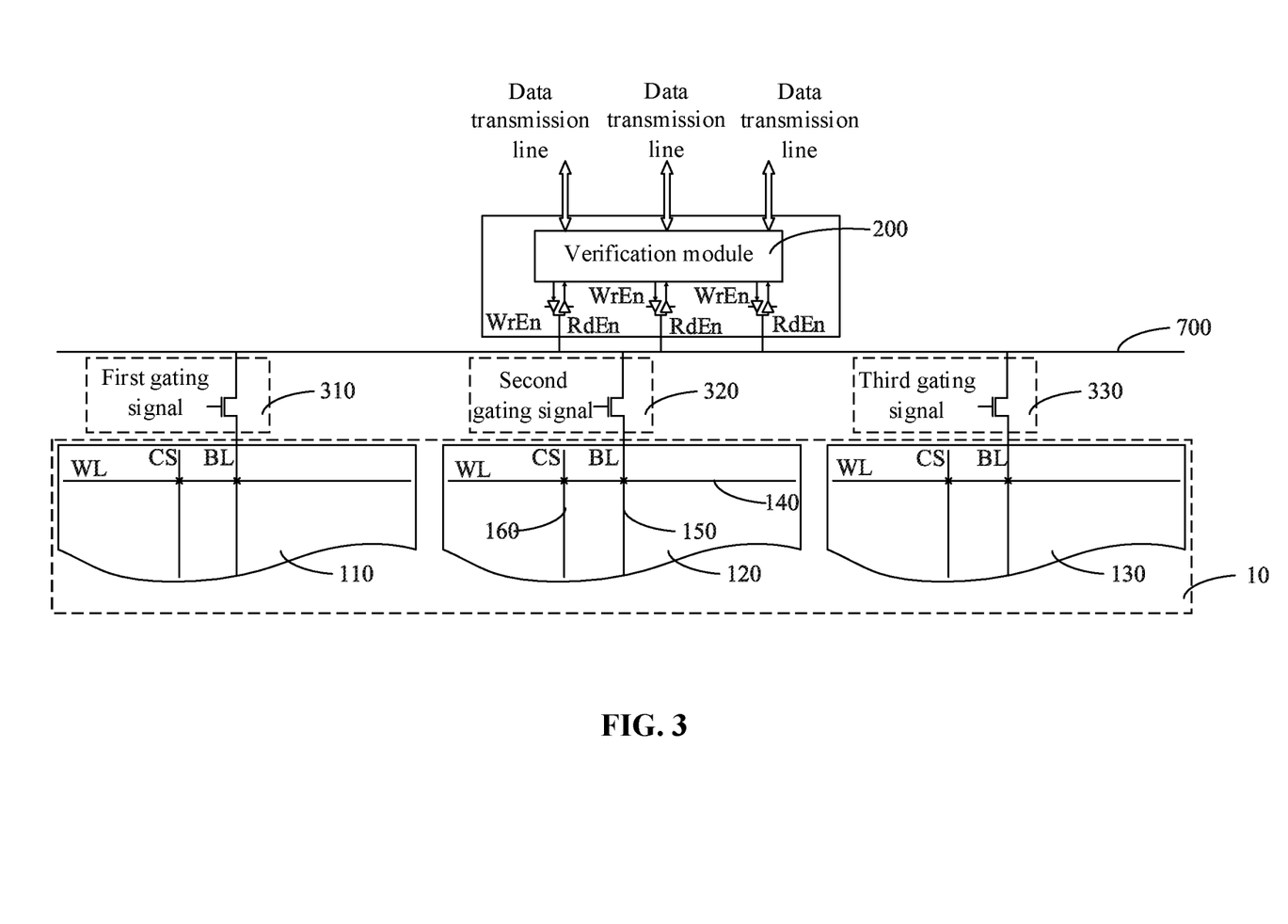
FIG. 3 is a structural schematic diagram of a semiconductor memory with a half storage block structure according to yet another embodiment.

FIG. 3 is a structural schematic diagram of a semiconductor memory with a half storage block structure according to yet another embodiment. Referring to FIG. 3, in this embodiment, the semiconductor memory includes three storage arrays 100 and a verification module 200. The storage arrays 100 are in one-to-one correspondence to the gating circuits 300. The storage arrays 100 are connected to the verification module 200 through the corresponding gating circuits 300 and the global data bus 700. Herein, the three storage arrays 100 are a first array 110, a second array 120 and a third array 130 respectively. The three gating circuits 300 are a first gating circuit 310, a second gating circuit 320 and a third gating circuit 330 respectively.

Specifically, at the same moment, at most one of the first gating circuit 310, the second gating circuit 320 and the third gating circuit 330 is turned on. That is, when the byte data port 600 corresponding to the verification module 200 in FIG. 3 performs data transmission, the data information is transmitted between the byte data port 600 and the verification module 200 through the data transmission lines. The verification module 200 is turned on, one of the first gating circuit 310, the second gating circuit 320 and the third gating circuit 330 is turned on, so that read-write of data information is performed in the storage array 100 corresponding to the turn-on gating circuit 300. When the corresponding byte data port 600 does not perform data transmission, the data transmission lines are not configured to transmit the data information, the verification module 200 is turned off, the first gating circuit 310, the second gating circuit 320 and the third gating circuit 330 are all turned off, so that the three storage arrays 110 are in a standby state and read-write of the data information is not performed therein.

In this embodiment, three storage arrays 100 are arranged in each storage block 10 so as to obtain a more optimized storage performance. Moreover, the verification module 200 and one of the three storage arrays 100 are selected to be turned on through the gating circuits 300, so as to realize read-write of the data information in different storage arrays 100. When read-write of data is performed in any one storage array 100, the data is verified through the same verification module 200 connected to the storage array 100, so that the number of the verification module 200 to be arranged is reduced and the occupied space of the verification module 200 in the semiconductor memory is reduced through a manner of improving the usage rate of the verification module 200, and then the semiconductor memory with higher integration and smaller volume is implemented.

Figure 4:
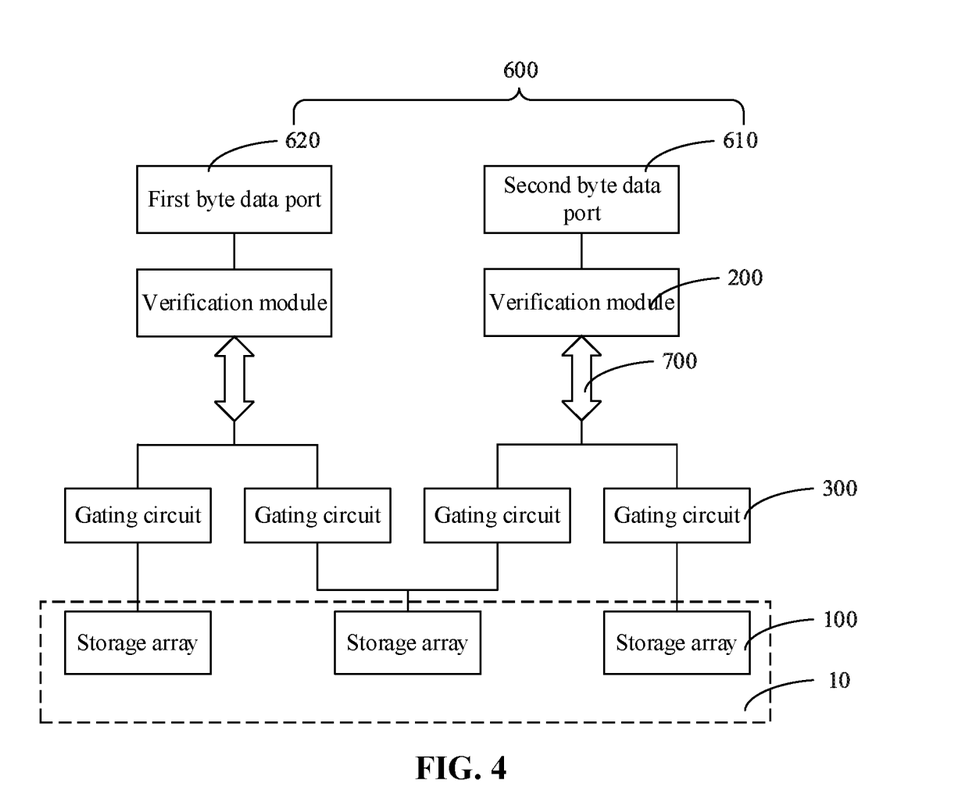
FIG. 4 is a structural schematic diagram of a semiconductor memory with a complete storage block structure according to an embodiment.

FIG. 4 is a structural schematic diagram of a semiconductor memory with a complete storage block structure according to an embodiment. FIG. 4 shows two byte data ports 600 and one storage block 10. The two byte data ports 600 specifically include first byte data ports 610 and second byte data ports 620. Each storage block 10 includes a multiple storage arrays 100, and at least part of the storage arrays 100 are respectively connected to the two verification modules 200 through the corresponding gating circuits 300. That is, in the semiconductor memory with the complete storage block structure, each storage block 10 may correspond to two byte data ports 600. For example, if each byte data port 600 can transmit 8-bit data, read-write of 16-bit data information may be performed synchronously in each storage block 10, thereby implementing better storage performances.

Figure 5:
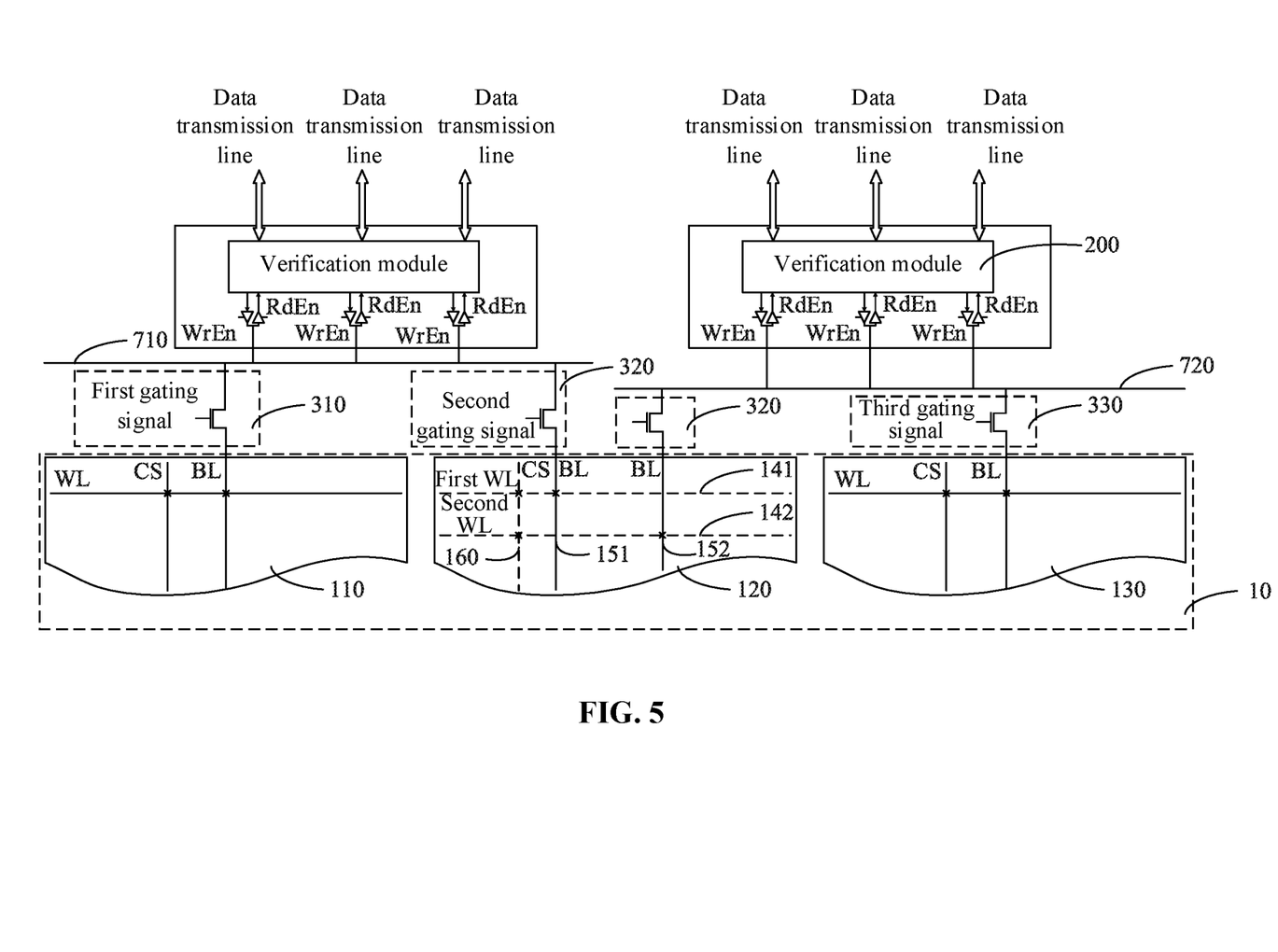
FIG. 5 is a structural schematic diagram of a semiconductor memory with a complete storage block structure according to another embodiment.

FIG. 5 is a structural schematic diagram of a semiconductor memory with a complete storage block structure according to another embodiment. Referring to FIG. 5, in this embodiment, the semiconductor memory includes three storage arrays 100 and two verification modules 200. The three storage arrays 100 include a first array 110, a second array 120 and a third array 130. The second array 120 is connected to two second gating circuits 320, and the second gating circuits 320 are connected in one-to-one correspondence to the global data buses 700.

Each verification module 200 is correspondingly connected to one global data bus 700. The second array 120 includes a first bit line 151 and a second bit line 152. The first bit line 151 is connected to one of the two second gating circuits 320, and the second bit line 152 is connected to the other of the two second gating circuits 320. It should be noted that the connection between the first bit line 151 and the second gating circuit 320 may be direct connection i.e., the first bit line 151 is connected to the second gating circuit 320 through wiring; or may also be indirect connection i.e., other control devices or processing devices may be added between the first bit line 151 and the second gating circuit 320, and the first bit line 151 is connected to the second gating circuit 320 through the abovementioned devices, so that a more abundant control function or a signal processing function is implemented. Similarly, the connection between the second bit line 152 and the second gating circuit 320 may be direct connection, or indirect connection, and details are not described herein.

The second array 120 further includes a column select line 160, a first word line 141 and a second world line 142. When data is written, the verification modules 200 transmit the data information to the corresponding global data buses 700 synchronously. When the data is read, the two verification modules 200 obtain the data information from the corresponding global data buses 700 synchronously. For example, in the embodiment as shown in FIG. 5, if the word line 140 and the column select line 160 of the first array 110 are enabled, the word line 140 and the column select line 160 of the third array 130 are enabled, the first word line 141, the second word line 142 and the column select line 160 of the second array 120 are disabled (as shown in the dotted line), the data transmission path between one verification module 200 and the first array 110 is conducted, and the data transmission path between the other verification module 200 and the third array 130 is conducted. Read-write of 8-bit data information may be performed in each storage array 100, so that read-write of 16-bit data information may be synchronously performed in each storage block 10, thereby implementing better performances.

Figure 6:
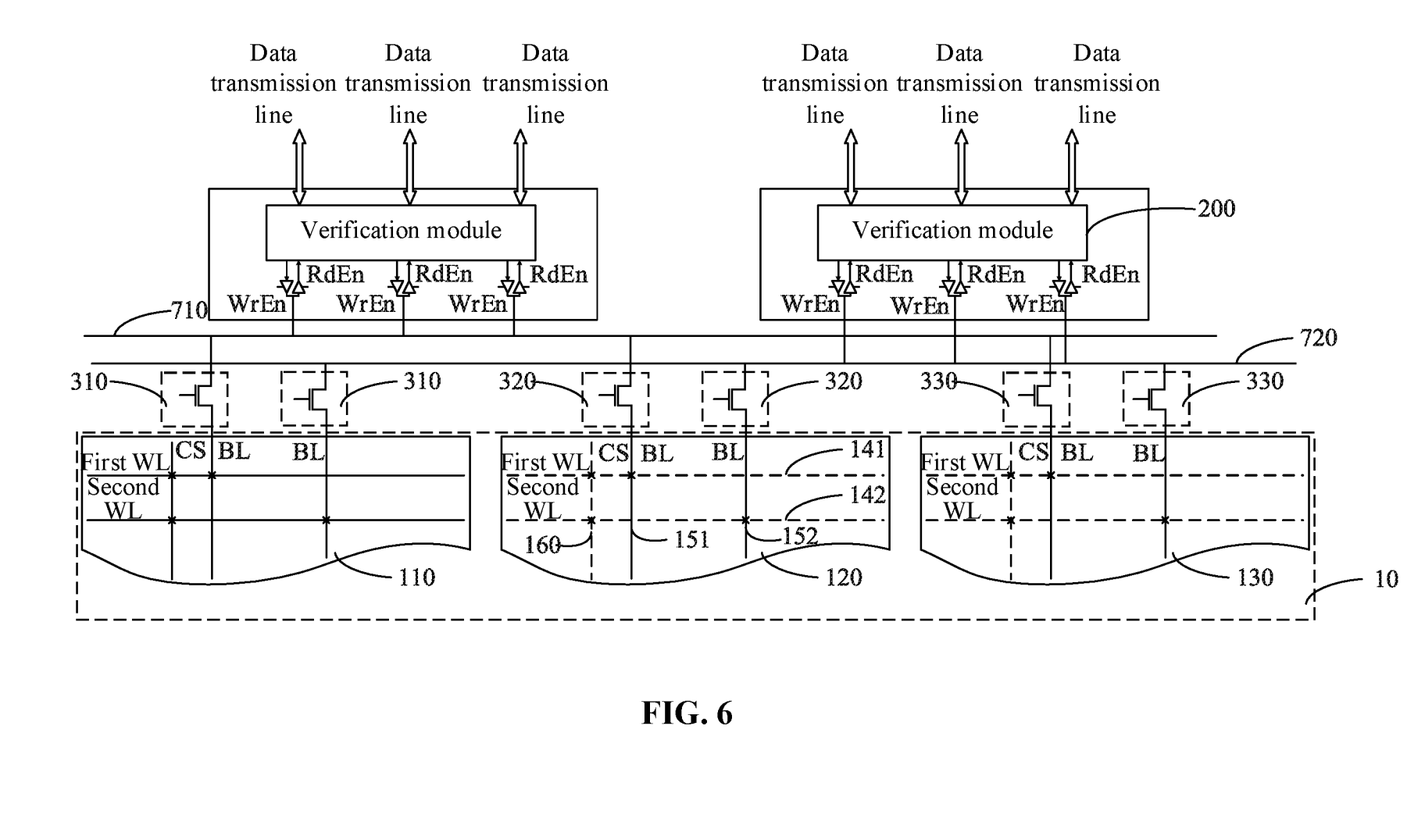
FIG. 6 is a structural schematic diagram of a semiconductor memory with a complete storage block structure according to yet another embodiment.

FIG. 6 is a structural schematic diagram of a semiconductor memory with a complete storage block structure according to yet another embodiment. Referring to FIG. 6, in one embodiment, the first array 110 is connected to two first gating circuits 310, the first gating circuits 310 are connected in one-to-one correspondence to the global data buses 700; the second array 120 is connected to two second gating circuits 320, the second gating circuits 320 are connected in one-to-one correspondence to the global data buses 700; and the third array 130 is connected to two third gating circuits 330, the third gating circuits 330 are connected in one-to-one correspondence to the global data buses 700. Herein, the first gating circuit 310, the second gating circuit 320 and the third gating circuit 330 that are connected to the same global data bus 700 are turned on at different times.

Specifically, each storage array 100 is provided with a first word line 141, a second word line 142, a first bit line 151, a second bit line 152 and a column select line 160 respectively. The first bit line 151 is connected to one global data bus 700 through one gating circuit 300, and the second bit line 152 is connected to another global data bus 700 through another grating circuit 300. In each process of read-write of the data, each verification module 200 may perform data information transmission with one of the three storage arrays 100, and the two verification modules 200 may perform data information transmission with the same storage array 100 synchronously. For example, in the embodiment as shown in FIG. 6, if the first word line 141, the second word line 142 and the column select line 160 of the first array 110 are enabled, the first word line 141, the second word line 142 and the column select line 160 of the second array 120 are disabled (as shown in the dotted line), and the first word line 141, the second word line 142 and the column select line 160 of the third array 130 are disabled, the data transmission paths between the two verification modules 200 and the first array 110 both are conducted, and the transmission of the data information is implemented. It can be seen from the figure that the same set of CS signal may be used for different byte data ports. If the word lines corresponding to the different byte data ports are turned on, when the CS signal is turned on, the data corresponding to each word line is connected to the global data buses corresponding to the different byte data ports, so the number of turn-on CS signals is saved by sharing the same set of CS signal, and then power consumption generated from turning on CS signals is saved.

Figure 7:
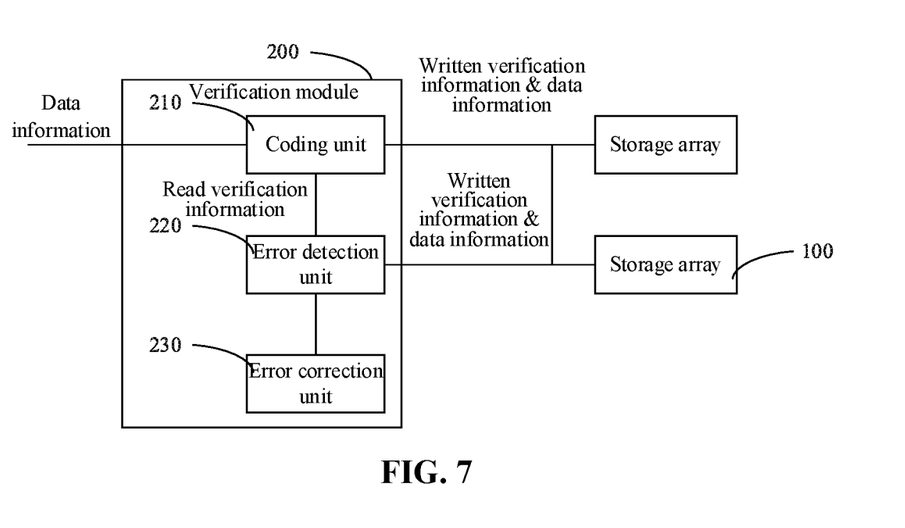
FIG. 7 is a structural schematic diagram of a verification module in a semiconductor memory according to an embodiment.

FIG. 7 is a structural schematic diagram of a verification module 200 in a semiconductor memory according to an embodiment. As shown in FIG. 7, in one embodiment, the verification module 200 includes a coding unit 210 and an error detection unit 220.

The coding unit 210 is connected to the storage array 100, and is configured to receive input data information, encode the data information to generate written verification information, and send the data information and the written verification information to the storage array 100.

The error detection unit 220 is connected to the storage array 100, and is configured to read the data information and the written verification information from the storage array 100 synchronously, and verify whether an error occurs in the read data information according to the written verification information.

It should be understood that the coding unit 210 encodes the data information according to a preset rule; therefore, the generated written verification information is in one-to-one correspondence to the data information. If it is found that the read data information does not match with the written verification information when the data is read, it shows that the data information changes in a read-write process of the data information, thereby resulting in the error of the data information. Therefore, the embodiment may accurately find whether an error occurs in the read data information through the coding unit 210 and the error detection unit 220, and the accuracy of the read data information is improved.

With continued reference to FIG. 7, the error detection unit 220 is also connected to the coding unit 210, the coding unit 210 is also configured to encode the read data information so as to generate the read verification information, and send the read verification information to the error detection unit 220. The error detection unit 220 is configured to obtain the written verification information and the read verification information, and compare the written verification information with the read verification information to judge whether an error occurs in the read data information.

In one embodiment, the verification module 200 further includes an error correction unit 230. The error correction unit 230 is connected to the error detection unit 220, and is configured to receive the read data information and the comparison result information of the error detection unit 220, and update the data information according to the comparison result information.

Specifically, the comparison result information includes whether the read data information is the same as the written data information. When the read data information is different from the written data information, the comparison result information further includes a specific error data bit. For example, if the written data information is 10000000 and the read data information is 11000000, the error data bit is the second bit. The error correction unit 230 is configured to receive the comparison result information and correct the error directly according to the comparison result information. For example, if the read data information is 11000000, and the second bit in the comparison result information is marked as the error data bit, the written data information must be 10000000; and then the error correction unit 230 may update the data information so as to complete the error correction. The embodiment may correct the read error data information by arranging the error correction unit 230, so as to output the correct read data information.

What is claimed is:

1. A semiconductor memory, comprising:
   three storage arrays;
   two verification modules, wherein each of the two verification modules corresponds to storage arrays of the three storage arrays, the each verification module is configured to verify whether an error occurs in data information of the corresponding storage arrays, and the each verification module is connected to a group of global data buses; and
   a plurality of gating circuits, wherein the gating circuits are connected between the three storage arrays and the global data buses, and the gating circuits are configured to control an activation of a data transmission path between the global data buses and the three storage arrays,
   wherein the three storage arrays comprise a first array, a second array and a third array; the second array is connected to two second gating circuits, and each of the two second gating circuits is connected with a corresponding one of the global data buses,
   wherein the first array is connected to at least one first gating circuit, and the third array is connected to at least one third gating circuit, wherein the first gating circuit, the second gating circuit and the third gating circuit, which are connected to a same global data bus, are turned on time-divisionally.

2. The semiconductor memory according to claim 1, wherein the second array comprises a first bit line and a second bit line, the first bit line is connected to one of the two second gating circuits, and the second bit line is connected to another one of the two second gating circuits.

3. The semiconductor memory according to claim 1, wherein the first array is connected to two first gating circuits, and each of the first gating circuits is connected with a corresponding one of the global data buses;
the third array is connected to two third gating circuits, each of the two third gating circuits is connected with a corresponding one of the global data buses.

4. The semiconductor memory according to claim 1, wherein the verification module comprises:
a coding unit, which is connected to the storage array, and is configured to receive input data information, encode the data information to generate written verification information, and send the data information and the written verification information to the storage arrays; and
an error detection unit, which is connected to the storage arrays, and is configured to synchronously read the data information and the written verification information from the storage arrays, and verify whether an error occurs in the read data information according to the written verification information.

5. The semiconductor memory according to claim 4, wherein the error detection unit is further connected to the coding unit, the coding unit is further configured to encode the read data information to generate the read verification information, and send the read verification information to the error detection unit;
the error detection unit is configured to obtain the written verification information and the read verification information, and compare the written verification information with the read verification information to judge whether the error occurs in the read data information.

6. The semiconductor memory according to claim 5, wherein the verification module further includes an error correction unit, the error correction unit is connected to the error detection unit, and is configured to receive the read data information and comparison result information of the error detection unit, and update the data information according to the comparison result information.

7. The semiconductor memory according to claim 1, wherein the semiconductor memory further comprises a gating control module, which is configured to generate a plurality of gating signals;
the gating circuits comprise switch transistors, control ends of the switch transistors are connected to the gating control module, first ends of the switch transistors are connected to the global data buses, second ends of the switch transistors are connected to the storage arrays, and the switch transistors are configured to control an activation of a data transmission path between the first ends and the second ends under the control of the gating signals.

8. The semiconductor memory according to claim 7, wherein the switch transistors are high-voltage switch transistors.

9. The semiconductor memory according to claim 7, wherein the switch transistors are turned on when the control ends of the switch transistors receive high-level signals.

10. The semiconductor memory according to claim 1, wherein the semiconductor memory further comprises at least one byte data port, each of the at least one byte data port is connected with a corresponding one of the two verification modules, and the byte data port is configured to receive data information input from outside or output the read data information to outside.

11. The semiconductor memory according to claim 1, wherein the semiconductor memory further comprises a read-write control module, which is connected between the two verification modules and the global data buses; the read-write control module is configured to receive a read-write enable signal, and select a data transmission direction between the two verification modules and global data buses corresponding to the two verification modules under the control of the read-write enable signal.

12. The semiconductor memory according to claim 1, wherein first ends of the gating circuits are connected to the three storage arrays, second ends of the gating circuits are connected to first ends of the global data buses, and second ends of the global data buses are connected to the two verification modules.

* * * * *